United States Patent
Sato et al.

(10) Patent No.: US 11,131,924 B2
(45) Date of Patent: Sep. 28, 2021

(54) METHOD AND APPARATUS FOR FORMING PATTERN ON IMPRINT MATERIAL

(71) Applicant: CANON KABUSHIKI KAISHA, Tokyo (JP)

(72) Inventors: Hiroshi Sato, Utsunomiya (JP); Hiroshi Morohoshi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 184 days.

(21) Appl. No.: 16/450,000

(22) Filed: Jun. 24, 2019

(65) Prior Publication Data

US 2020/0004139 A1    Jan. 2, 2020

(30) Foreign Application Priority Data

Jun. 28, 2018  (JP) .............................. JP2018-123520

(51) Int. Cl.
    *G03F 7/00*  (2006.01)
(52) U.S. Cl.
    CPC .................................. *G03F 7/0002* (2013.01)
(58) Field of Classification Search
    CPC ............... G03F 7/0002; G03F 7/70408; G03F 7/70775; G01B 11/26; B82Y 10/00
    USPC ............... 101/481; 355/52, 55; 356/399–401
    See application file for complete search history.

(56) References Cited

U.S. PATENT DOCUMENTS

| 6,411,386 B1* | 6/2002 | Nishi ..................... G01B 11/26 |
| | | 356/399 |
| 10,216,104 B2 | 2/2019 | Nakagawa | |
| 2011/0290136 A1* | 12/2011 | Koga ..................... B82Y 10/00 |
| | | 101/481 |

FOREIGN PATENT DOCUMENTS

JP          2016143838 A         8/2016

\* cited by examiner

*Primary Examiner* — Hung Nguyen
(74) *Attorney, Agent, or Firm* — Rossi, Kimms & McDowell LLP

(57) ABSTRACT

A method for forming a pattern of an imprint material on a shot region of a substrate by using a mold, includes determining a plurality of marks for alignment of the shot region and the mold, performing measurement for the alignment using the plurality of marks determined in the determining, setting an origin position of a coordinate system for acquisition of an alignment error between the shot region and the mold based on an arrangement of the plurality of marks determined in the determining, and acquiring the alignment error based on a measurement result in the measurement and the origin position determined in the setting.

17 Claims, 14 Drawing Sheets

BRIGHT    DARK    BRIGHT    DARK    BRIGHT

DARK    BRIGHT    DARK    BRIGHT    DARK

FIG. 3A
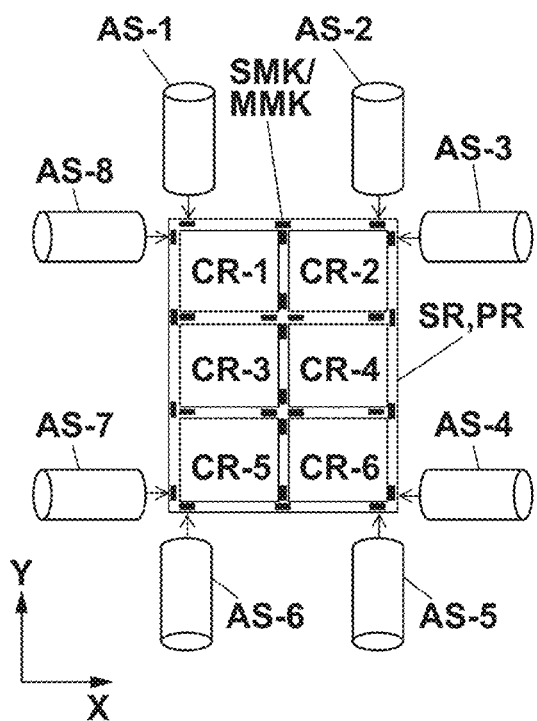
FIG. 3B
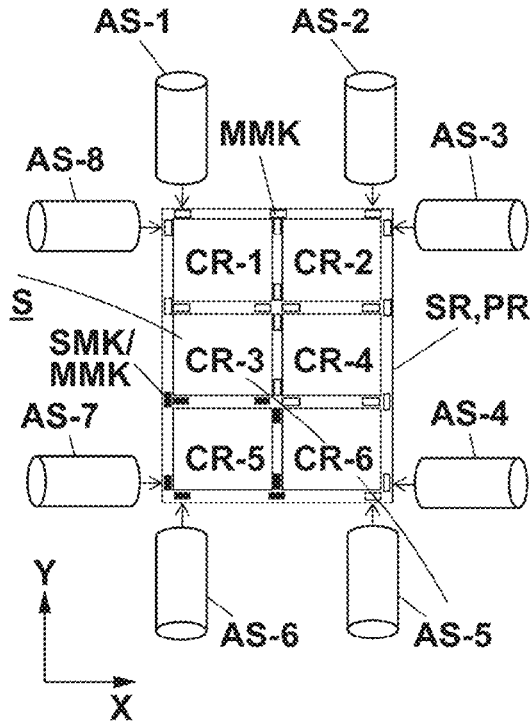
FIG. 3C (SHIFT)

✗ ORIGIN POSITION OF COORDINATE SYSTEM (ROTATION)

✗ ORIGIN POSITION OF COORDINATE SYSTEM (MAGNIFICATION)

✗ ORIGIN POSITION OF COORDINATE SYSTEM (TRAPEZOID)

✗ ORIGIN POSITION OF COORDINATE SYSTEM

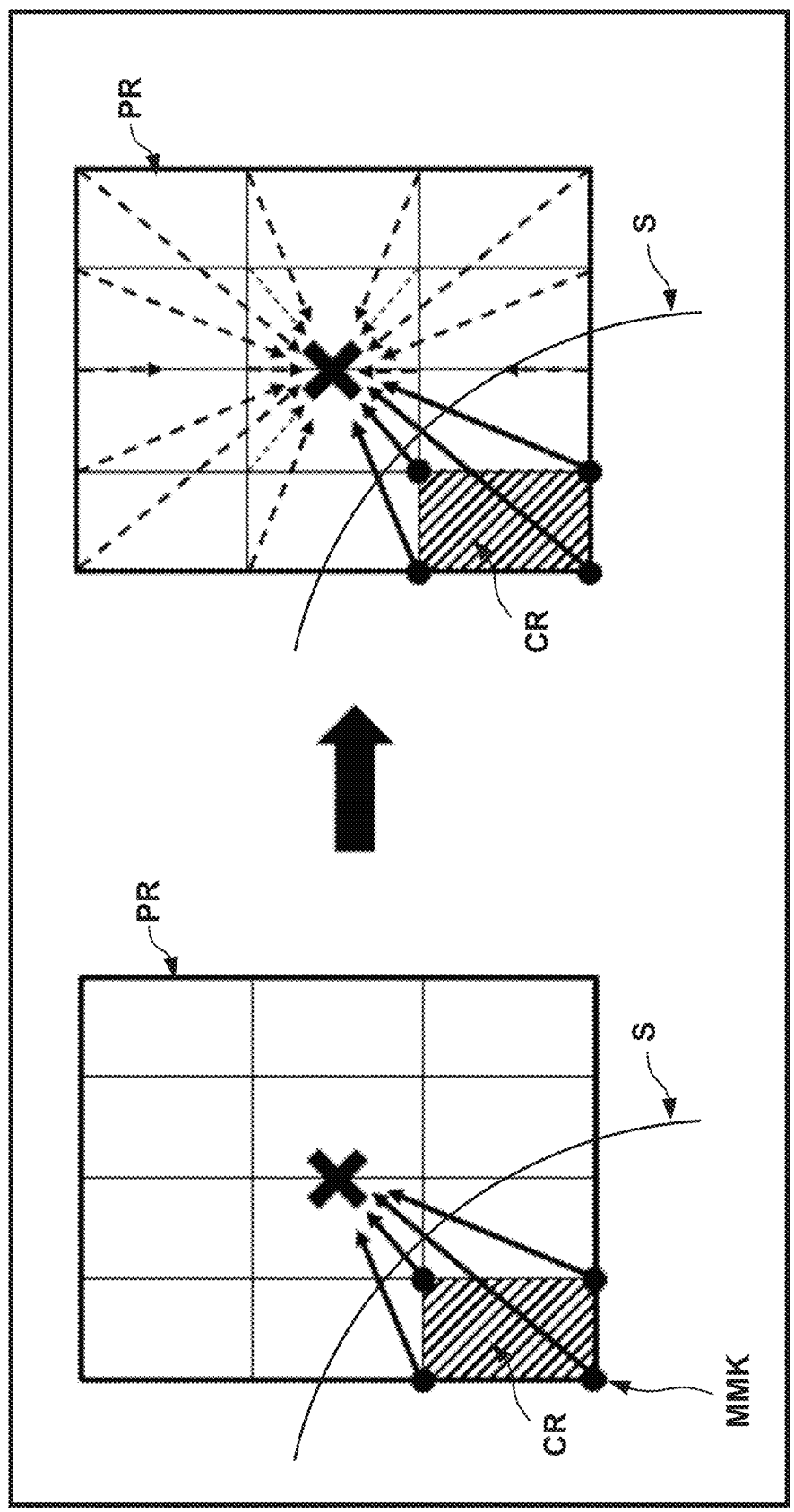

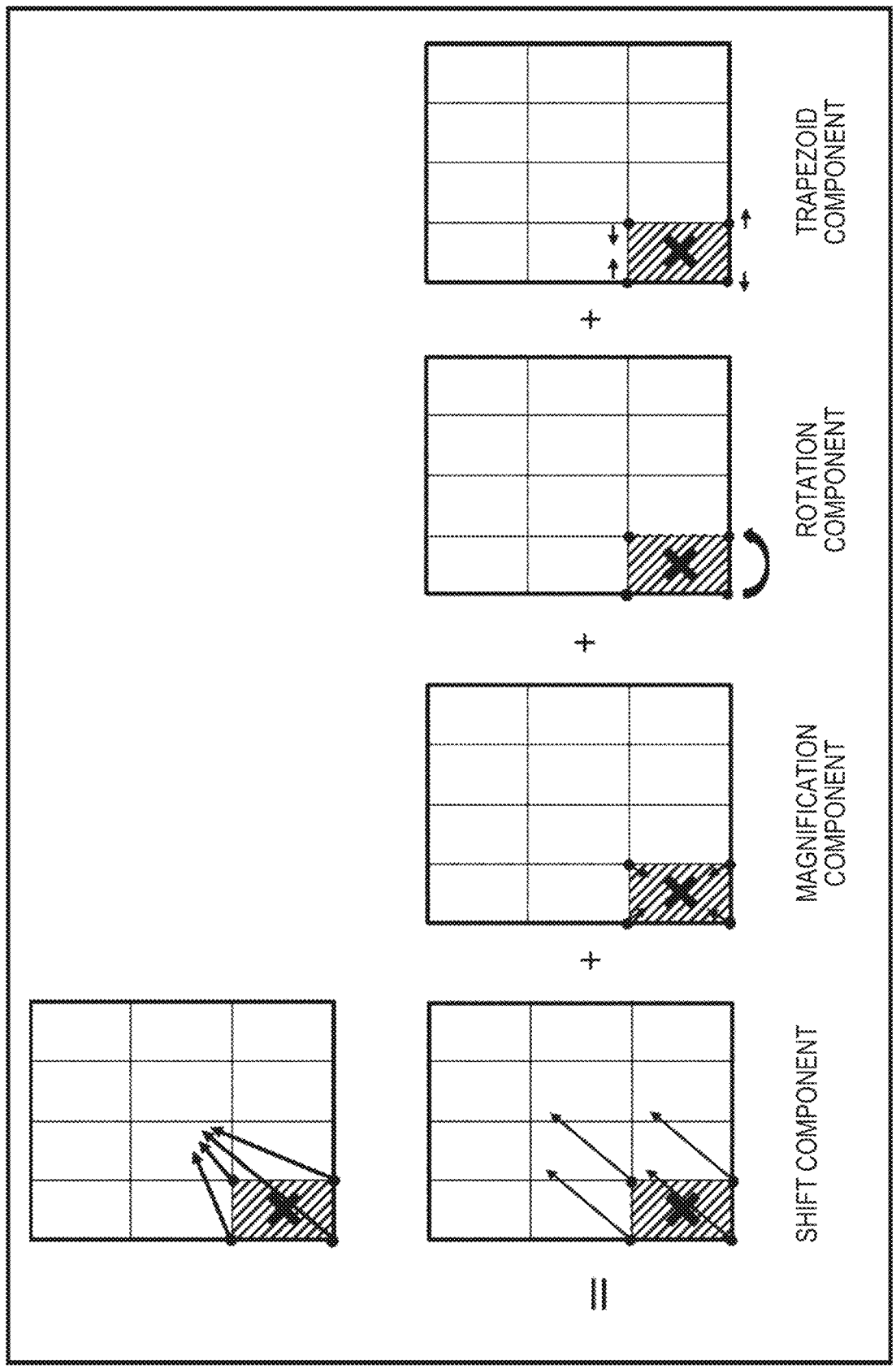

METHOD AND APPARATUS FOR FORMING PATTERN ON IMPRINT MATERIAL

BACKGROUND OF THE INVENTION

Field of the Invention

The present invention relates to a method of forming a pattern of an imprint material, an imprint apparatus, a method of adjusting the imprint apparatus, and a method of manufacturing an article.

Description of the Related Art

As a new technique for manufacturing articles such as semiconductor devices, an imprint technique for forming a pattern of an imprint material on a plurality of shot regions of a substrate by using a mold has begun to be used. In the imprint technique, in order to improve the alignment accuracy between a shot region of a substrate and a pattern region of a mold, an alignment error as a difference between the shape of the shot region and the shape of the pattern region can be detected by using marks provided for the shot region and the pattern region. When there is a difference in shape between the shot region and the pattern region, the difference can be reduced by changing at least one of the shot region and the pattern region based on the difference (Japanese Patent Laid-Open No. 2016-143838). An alignment error can be decomposed into a plurality of components such as a shift component, magnification component, rotation component, trapezoid component, and skew component.

Shot regions on a substrate can have different geometric characteristics in accordance with the positions of the shot regions. For example, a plurality of shot regions arranged on a substrate can include a shot region having a rectangular shape (full shot region) and a shot region defined by an edge of the substrate (partial shot region). A full shot region and a partial shot region can differ in the positions and layouts of a plurality of marks used to detect an alignment error. In addition, even a full shot region is sometimes aligned by using marks at positions different from planned positions or a smaller number of marks than planned because of defective marks. As described above, the positions and layout of marks used for detecting an alignment error can differ for each shot region.

SUMMARY OF THE INVENTION

The present inventor has thought that an alignment error can be properly corrected by acquiring alignment error components with reference to the central position of a shot region as the origin position regardless of the positions and layout of a plurality of marks used to detect alignment errors. However, the present inventor has found out, as a result of studies, that such a acquisition method is not preferable.

The present invention provides a technique advantageous in properly correcting an alignment error.

One of aspects of the present invention provides a method for forming a pattern of an imprint material on a shot region of a substrate by using a mold, the method comprising: determining a plurality of marks for alignment of the shot region and the mold; performing measurement for the alignment using the plurality of marks determined in the determining; setting an origin position of a coordinate system for acquisition of an alignment error between the shot region and the mold based on an arrangement of the plurality of marks determined in the determining; and acquiring the alignment error based on a measurement result in the measurement and the origin position determined in the setting.

Further features of the present invention will become apparent from the following description of exemplary embodiments with reference to the attached drawings.

BRIEF DESCRIPTION OF THE DRAWINGS

FIGS. 3A to 3C are views each exemplarily showing the positional relationship between alignment scopes, a shot region of a substrate, marks on the substrate, and marks on a mold at the time of detection of an alignment error;

FIG. 8 is a view for explaining a comparative example;

FIG. 9 is a view exemplarily showing the distribution of an alignment error according to the second embodiment of the present invention;

DESCRIPTION OF THE EMBODIMENTS

The present invention will be described below through exemplary embodiments with reference to the accompanying drawings.

Figure 1:
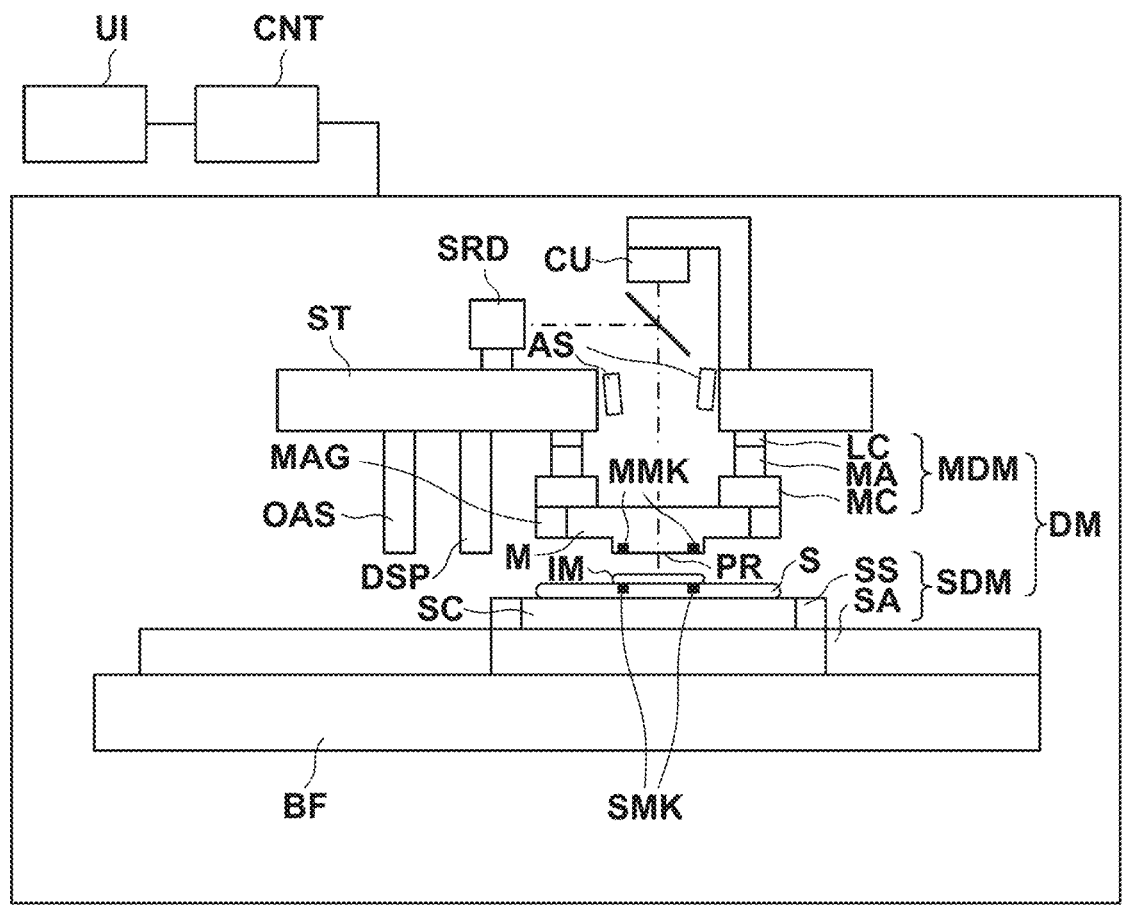
FIG. 1 is a view showing the arrangement of an imprint apparatus according to the first embodiment of the present invention.

FIG. 1 shows the arrangement of an imprint apparatus 100 according to the first embodiment of the present invention. The imprint apparatus 100 is configured to form a pattern formed from a cured product of an imprint material IM on a plurality of shot regions of a substrate S by an imprint process. An imprint process is a process of forming a pattern formed from a cured product of the imprint material IM on a plurality of shot regions of the substrate S by using a mold M. An imprint process can include, for example, a contact process, alignment process, curing process, and separation process. A contact process is a process of bringing a pattern region PR of the mold M into contact with an imprint material IM on a shot region of the substrate S. An alignment process is a process of aligning a shot region of the substrate S with the pattern region PR of the mold M. An alignment process in an imprint process can include a deformation process of deforming at least one of the pattern region PR of the mold M and a shot region of the substrate S so as to reduce the overlay error between the shot region of the substrate S and the pattern region PR of the mold M. A curing process is a process of curing the imprint material IM. A separation process is a process of separating a pattern formed from a cured product of the imprint material IM from the pattern region PR of the mold M.

As an imprint material, a curable composition (to be also referred to a resin in an uncured state) to be cured by receiving the curing energy is used. Examples of the curing energy are an electromagnetic wave, heat, and the like. The electromagnetic wave is, for example, light selected from the wavelength range of 10 nm (inclusive) to 1 mm (inclusive). Examples of the electromagnetic wave can be infrared light, a visible light beam, and ultraviolet light. The curable composition can be a composition cured with light irradiation or heating. Among these compositions, the photocurable composition cured by light irradiation contains at least a polymerizable composition and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film obtained by connecting a plurality of droplets supplied by the imprint material supplier. The viscosity (the viscosity at 25° C.) of the imprint material is, for example, 1 mPa·s (inclusive) to 100 mPa·s (inclusive). Examples of the substrate material can be glass, a ceramic, a metal, a semiconductor, a resin, and the like. A member made of a material different from the substrate may be formed on the surface of the substrate, as needed. Examples of the substrate are a silicon wafer, a compound semiconductor wafer, and silica glass.

In the specification and the accompanying drawings, directions will be indicated by an XYZ coordinate system in which directions parallel to the surface of the substrate S are set as the X-Y plane. Assume that directions parallel to the X-axis, the Y-axis, and the Z-axis of the XYZ coordinate system are the X direction, the Y direction, and the Z direction, respectively. Assume that a rotation about the X-axis, a rotation about the Y-axis, and a rotation about the Z-axis are θX, θY, and θZ, respectively. Control operations or driving operations related to the X-axis, the Y-axis, and the Z-axis represent control operations or driving operations related to a direction parallel to the X-axis, a direction parallel to the Y-axis, and a direction parallel to the Z-axis, respectively. In addition, control operations or driving operations related to the θX-axis, the θY-axis, and the θZ-axis indicate control operations or driving operations related to a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning indicates control of the position and/or orientation. Alignment (positioning) or an alignment process can include control of the position and/or orientation of at least one of the substrate and the mold.

The imprint apparatus 100 can include a substrate driving mechanism SDM for holding and driving the substrate S, a base frame BF for supporting the substrate driving mechanism SDM, a mold driving mechanism MDM for holding and driving the mold M, and a structure ST for holding the mold driving mechanism MDM. The substrate driving mechanism SDM can include a substrate stage SS including a substrate chuck SC for holding the substrate S and a substrate positioning mechanism SA for positioning the substrate S by positioning the substrate stage SS. The mold driving mechanism MDM can include a mold chuck MC for holding the mold M and a mold positioning mechanism MA for positioning the mold M by positioning the mold chuck MC. The mold driving mechanism MDM may include a load cell LC for detecting the force exerted on the mold M in a contact process and/or a separation process. The mold driving mechanism MDM can further include a pressure mechanism for applying a pressure on a surface on the opposite side to the pattern region PR of the mold M so as to deform the pattern region PR into a convex shape toward the substrate S.

The substrate driving mechanism SDM and the mold driving mechanism MDM constitute a driving mechanism DM for driving at least one of the substrate S and the mold M so as to change the relative position between the substrate S and the mold M. Changing the relative position by using the driving mechanism DM includes driving for bringing the pattern region PR of the mold M into contact with the imprint material IM on the substrate S and separating the mold M from the cured imprint material (the pattern of the cured product). In other words, changing the relative position by using the driving mechanism DM includes changing the relative position between the substrate S and the mold M so as to perform a contact process and a separation process. The substrate driving mechanism SDM can be configured to drive the substrate S with respect to a plurality of axes (for example, three axes including the X-axis, Y-axis, and θZ-axis, and preferably six axes including the X-axis, Y-axis, Z-axis, θX-axis, θY-axis, and θZ-axis). The mold driving mechanism MDM can be configured to drive the mold M with respect to a plurality of axes (for example, three axes including the Z-axis, θX-axis, and θY-axis, and preferably six axes including the X-axis, Y-axis, Z-axis, θX-axis, θY-axis, and θZ-axis).

The imprint apparatus 100 can further include a deformation mechanism MAG that deforms the pattern region PR of the mold M. The deformation mechanism MAG can deform the pattern region PR so as to change the shape (including the size) of the pattern region PR within a plane parallel to an X-Y plane. The deformation mechanism MAG can deform the pattern region PR by applying forces to the four side surfaces of the mold M. The imprint apparatus 100 can further include a shot region deformation unit SRD that deforms a shot region of the substrate S. The shot region deformation unit SRD can deform a shot region so as to change the shape (including the size) of the shot region within a plane parallel to an X-Y plane. The shot region deformation unit SRD can deform a shot region of the substrate S by forming a temperature distribution on the substrate S. A temperature distribution can be formed by irradiating the substrate S with light having a wavelength that does not cure an imprint material and is selected from the wavelength range of ultraviolet light or the wavelength range of visible light.

The imprint apparatus 100 can include a dispenser DSP. The dispenser DSP may be configured as an external apparatus of the imprint apparatus 100. The dispenser DSP arranges the imprint material IM on a shot region of the substrate S. The imprint material IM can be arranged on a shot region of the substrate S, while the substrate S is driven by the substrate driving mechanism SDM, by causing the dispenser DSP to discharge the imprint material IM in synchronism with the driving. In this case, every time the dispenser DSP arranges the imprint material IM on one shot region on the substrate S, a contact process, alignment process, curing process, and separation process can be executed. Alternatively, after the dispenser DSP arranges the imprint material IM on a plurality of shot regions on the substrate S, a contact process, alignment process, curing process, and separation process may be executed for each of the plurality of shot regions.

The imprint apparatus 100 can further include a curing unit CU. The curing unit CU cures the imprint material IM by irradiating the imprint material IM with curing energy while the pattern region PR of the mold M is in contact with the imprint material IM on the substrate S. This forms a pattern formed from a cured product of the imprint material IM on the substrate S.

The imprint apparatus 100 can include an alignment detection system (measurement device) AS that detects (measures) the positions of marks SMK on a shot region of the substrate S, the positions of marks MMK on the mold M, the relative positions between the marks SMK on the shot region of the substrate S and the marks MMK on the mold M, and the like. The alignment detection system AS can detect the relative positions between the marks SMK on a shot region of the substrate S and the marks MMK on the mold M based on, for example, the moire pattern formed by the marks SMK on a shot region of the substrate S and the marks MMK on the mold M. The imprint apparatus 100 can include an off-axis scope OAS that detects (measures) the position of the mark SMK on a shot region of the substrate S.

The imprint apparatus 100 can further include a controller CNT. The controller CNT can control the driving mechanism DM, the deformation mechanism MAG, the shot region deformation unit SRD, the dispenser DSP, the curing unit CU, the alignment detection system AS, and the off-axis scope OAS. The controller CNT can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general purpose computer embedded with a program, or a combination of all or some of these components.

The controller CNT can compute the overlay error between a shot region of the substrate S and the pattern region PR of the mold M based on the detection results obtained by the alignment detection system AS, for example, the relative positions between the marks SMK on the substrate S and the marks MMK on the mold M. In other words, the controller CNT can compute the alignment error between the shot region of the substrate S and the pattern region PR of the mold M based on outputs from the alignment detection system AS. An alignment error is a concept including an overlay error. An alignment error or overlay error can include, for example, a plurality of components (for example, a shift component, magnification component, rotation component, trapezoid component, and skew component).

Figure 2A:
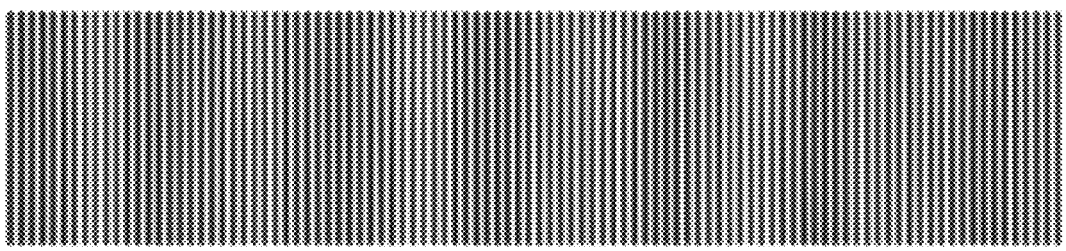
FIGS. 2A to 2D are views for explaining the principle of detecting the relative position between two marks by using a moire pattern.
Figure 2B:
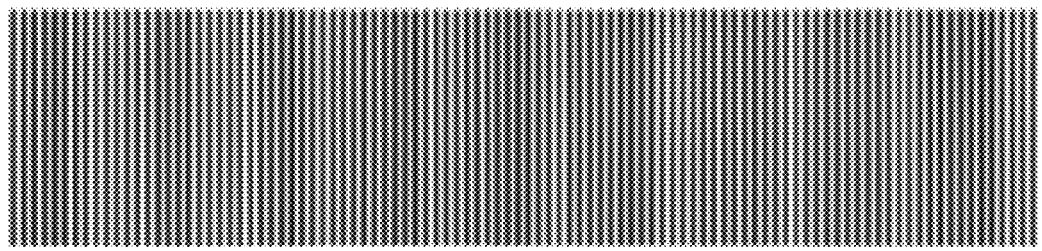
Figure 2C:
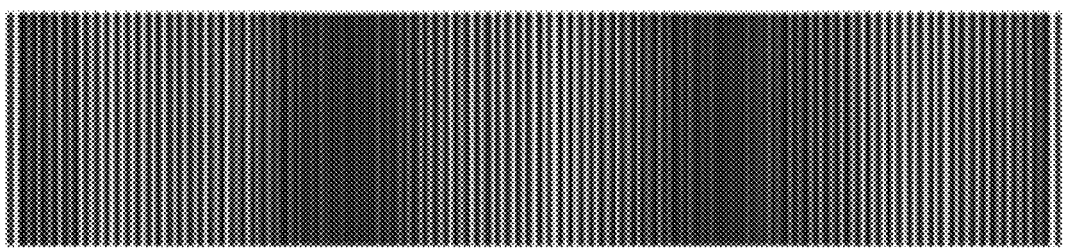
Figure 2D:
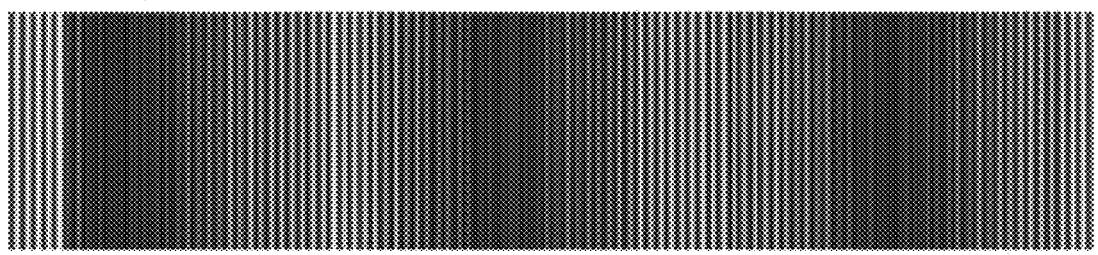

The principle of detecting a relative position which can be applied to the alignment detection system AS, more specifically, the principle of detecting (measuring) the relative position between two marks by using a moire pattern will be described with reference to FIGS. 2A to 2D. FIGS. 2A and 2B show two types of grating marks with different pitches. One of the two types of grating marks is the mark SMK on the substrate S, and the other is the mark MMK on the mold M. Overlaying these grating marks on each other will generate a bright and dark stripe pattern like that shown in FIG. 2C. This stipe pattern is a moire pattern. The positions of the bright fringes and dark fringes of a moire pattern change depending on the relative position between the two types of grating marks. For example, when one of the two types of grating marks is slightly moved to the right, the moire pattern shown in FIG. 2C changes to a moire pattern like that shown in FIG. 2D. This moire pattern is generated as large bright and dark fringes with an increased shift amount between the two types of grating marks, and hence allows even the alignment detection system AS with low resolution to accurately detect the relative positional relationship between the two types of grating marks. The alignment detection system AS can detect the relative position between the mark SMK on the substrate S and the mark MMK on the mold M (its pattern region PR) based on such a principle.

The above has exemplified the case of detecting the relative position between the mark SMK on a shot region of the substrate S and the mark MMK on the mold M by using a moire pattern. However, this is merely an example. The alignment detection system AS may detect the relative position between the mark SMK on a shot region of the substrate S and the mark MMK on the mold M in accordance with another principle or method. For example, the alignment detection system AS may detect the relative position between the mark SMK on a shot region of the substrate S and the mark MMK on the mold M based on the position of an image of the mark SMK in a visual field and the position of an image of the mark MMK in the visual field. Alternatively, the alignment detection system AS may detect the relative position between the mark SMK on a shot region of the substrate S and the mark MMK on the mold M based on the relative position between an image of the mark SMK in a visual field and an image of the mark MMK in a visual field.

FIGS. 3A to 3C exemplarily show the positional relationship between the alignment system AS, a shot region SR of the substrate S, the marks (substrate-side marks) SMK on the substrate S, and the marks (mold-side marks) MMK on the mold M. FIG. 3A shows how an alignment error concerning a full shot region is detected. FIG. 3C shows how an alignment error concerning a partial shot region is detected. FIG. 3B is a reference figure for explaining differences between a full shot region and a partial shot region. A full shot region (first shot region) is the shot region SR having a rectangular shape. A full shot region has the same shape as that of the pattern region PR on the mold M. A partial shot region (second shot region) is the shot region SR whose shape is defined by edges of the substrate S. A full shot region (first shot region) includes the first count of chip regions, and a partial shot region (second shot region) includes the second count of chip regions smaller than the first count. FIGS. 3A to 3C show both a full shot region and a partial shot region as shot regions SR.

In this case, a full shot region includes six chip regions CR-1, CR-2, CR-3, CR-4, CR-5, and CR-6. In contrast to this, a partial shot region includes only a chip region or chip regions of the six chip regions CR-1, CR-2, CR-3, CR-4, CR-5, and CR-6 which falls or fall inside the effective region of the substrate S. In the case shown in FIGS. 3B and 3C, the partial shot region includes only the chip region CR-5. Although FIGS. 3B and 3C each show all the chip regions CR-1, CR-2, CR-3, CR-4, CR-5, and CR-6, this is for convenience sake only. Referring to FIGS. 3B and 3C, partial shot region of the substrate S actually includes only the chip region CR-5. Note that the effective region of the substrate S is a region of the entire principal surface of the substrate S which allows the formation of a pattern. Referring to FIGS. 3A to 3C, each mark SMK on the substrate S and each mark MMK on the mold M are indicated by small rectangles. Of these rectangles, the solid black rectangles are the marks SMK and MMK that enable the detection of a relative position. In contrast to this, the hollow rectangles are the marks MMK by which the detection of the relative position with respect to the marks SMK is not possible because the marks SMK on the substrate S side do not actually exist.

In the cases shown in FIGS. 3A to 3C, the alignment detection system AS includes eight alignment scopes AS-1 to AS-8. The eight alignment scopes AS-1 to AS-8 are configured to detect the relative positions between the marks SMK on the substrate S and the corresponding marks MMK on the mold M. In this case, the alignment scopes AS-1, AS-2, AS-5, and AS-6 detect the relative positions between the marks SMK and the marks MMK in the X direction. The alignment scopes AS-3, AS-4, AS-7, and AS-8 detect the relative positions between the marks SMK and the marks MMK in the Y direction.

Figure 4:
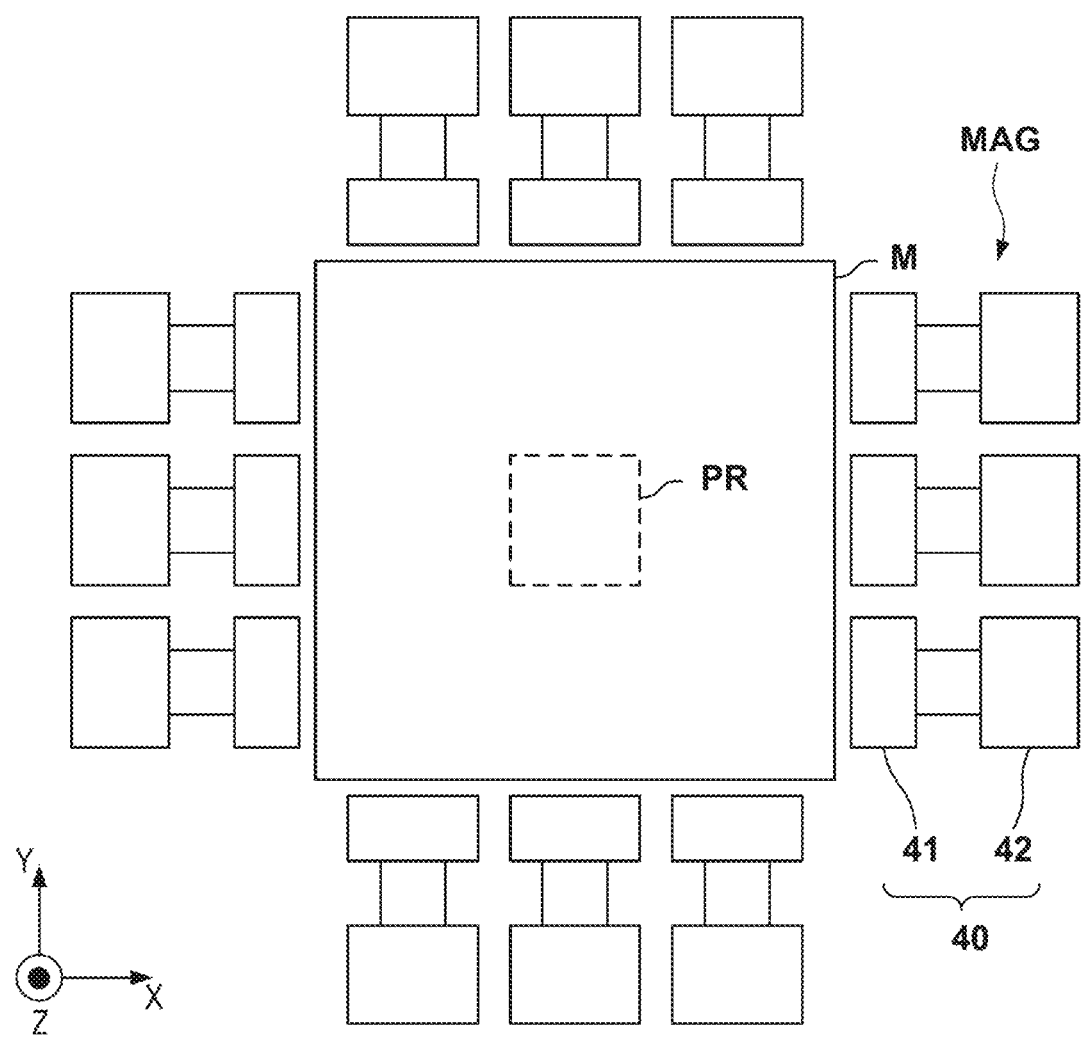
FIG. 4 is a view exemplarily showing the arrangement of a deformation mechanism.

FIG. 4 shows an example of the arrangement of the deformation mechanism MAG. The deformation mechanism MAG can include, for example, a plurality of force applying units 40 that apply a force to side surfaces of the mold M. Each force applying unit 40 can include a suction unit 41 that sucks a side surface of the mold M and an actuator 42 that presses the suction unit 41 against a side surface of the mold M and moves the suction unit 41 away from the side surface of the mold M. The controller CNT acquires the relationship between command values given to the actuator 42 and the deformation amounts of the mold M in advance, and then sends, to the actuator 42, the command value determined based on the relationship and the required deformation amount determined based on the measurement result obtained by the alignment detection system AS. The deformation mechanism MAG can correct (reduce), for example, a magnification component, trapezoid component, and skew component of a plurality of components constituting the alignment error (overlay error) between the shot region SR and the pattern region PR.

When an alignment error is to be detected with respect to a full shot region, as exemplarily shown in FIG. 3A, eight mark pairs are used, out of a plurality of mark pairs (marks SMK and MMK) provided for the full shot region, which are arranged as outward as possible. In this case, the alignment scopes AS-1 to AS-8 can be respectively positioned at positions respectively corresponding to the eight mark pairs.

However, the alignment scopes AS-1 to AS-8 arranged in this manner cannot detect any alignment error with respect to a partial shot region. For example, in the case shown in FIG. 3B, only the alignment scopes AS-6 and AS-7 can detect the relative position between the marks SMK and MMK. Accordingly, when an alignment error is to be detected with respect to a partial shot region, as exemplarily shown in FIG. 3C, a plurality of mark pairs (marks SMK and MMK) provided for the effective chip region CR-5 or its adjacent chip region, for example, eight mark pairs can be used. In this case, the alignment scopes AS-1 to AS-8 can be positioned at positions respectively corresponding to the eight mark pairs.

The controller CNT computes the alignment error between the shot region SR and the pattern region PR based on the relative positions between the respective mark pairs SMK and MMK detected by using the alignment detection system AS (alignment scopes AS-1 to AS-8). In this alignment error computation, the origin position of the coordinate system needs to be determined.

In a comparative example, in both a full shot region and a partial shot region, the center of a pattern region is set as the origin position of a coordinate system for the computation (acquisition) of an alignment error. In this case, there is no problem in setting the center of the pattern region PR as the origin position of the coordinate system for the computation of an alignment error with respect to a full shot region. However, there is a problem in setting the center of the pattern region PR as the origin position of the coordinate system for the computation of an alignment error with respect to a partial shot region. Although the center of the full shot region coincides with the center of the pattern region PR, the center of the partial shot region does not coincide with the center of the pattern region PR because the partial shot region is smaller than the full shot region (or the pattern region PR).

Figure 5A:
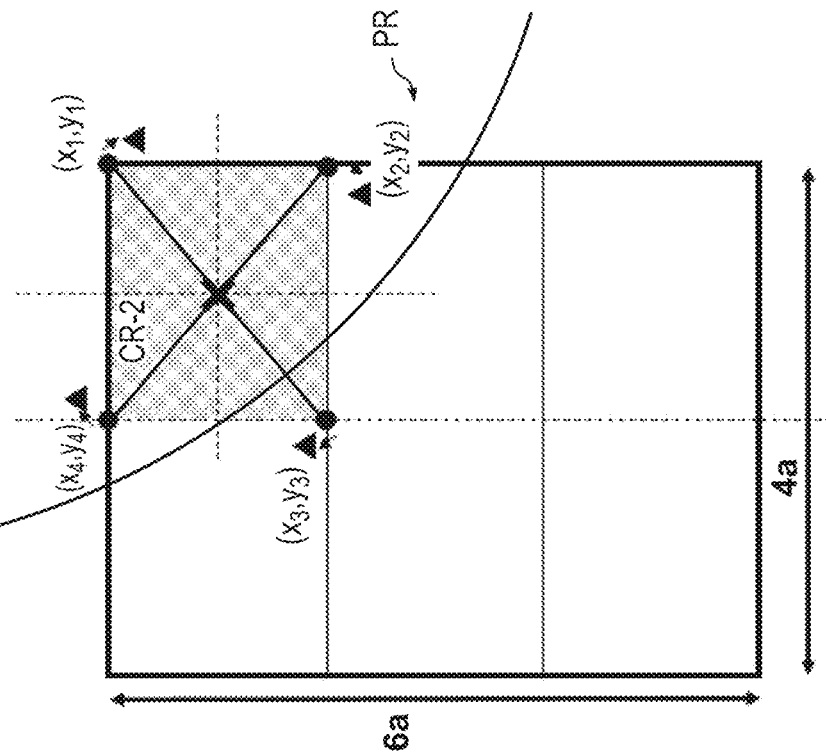
FIGS. 5A and 5B are views for explaining the origin position of a coordinate system for computing an alignment error.

The following will describe, with reference to FIG. 5A, a problem in setting the center of the pattern region PR as the origin position of the coordinate system for the computation of an alignment error with respect to a partial shot region.

FIG. 5A exemplarily shows a partial shot region wherein only the chip region CR-2 of the chip regions CR-1 to CR-6 falls inside the effective region of the substrate S. The black circles indicate the positions of the marks MMK on the pattern region PR which correspond to the marks SMK located at the four corners of the chip region CR-2. The black triangles indicate the actual positions of the marks SMK located at the four corners of the chip region CR-2. Assume that in this case, the alignment detection system AS detects the relative positions between the positions of the black circles and the black triangles. For the sake of simplicity, assume that the marks MMK on the mold M have no error, and the positions of the marks MMK coincide with the design positions.

Let $(x_1, y_1)$ be the position of the mark MMK on the pattern region PR which corresponds to the mark SMK located at the upper right of the chip region CR-2, $(x_2, y_2)$ be the position of the mark MMK on the pattern region PR which corresponds to the mark SMK located at the lower right of the chip region CR-2, $(x_3, y_3)$ be the position of the mark MMK on the pattern region PR which corresponds to the mark SMK located at the lower left of the chip region CR-2, and $(x_4, y_4)$ be the position of the mark MMK on the pattern region PR which corresponds to the mark SMK located at the upper left of the chip region CR-2.

Let $(\Delta x_1, \Delta y_1)$ be the shift amount (alignment error) of the position of the mark SMK at the upper right with respect to $(x_1, y_1)$. If $(\Delta x_1, \Delta y_1)$ is defined as the sum of shift components, magnification components, rotation components, and trapezoid components, $(\Delta x_1, \Delta y_1)$ is expressed as equations (1) given below:

$$\Delta x_1 = Sx + Mx \cdot x_1 + rot\theta x \cdot y_1 + Tx \cdot x_1 \cdot y_1$$

$$\Delta y_1 = Sy + My \cdot y_1 + rot\theta y \cdot x_1 + Ty \cdot x_1 \cdot y_1 \quad (1)$$

where Sx and Sy are shift components, Mx and My are magnification components, $rot\theta x$ and $rot\theta y$ are rotation components, and Tx and Ty are trapezoid components. Although the alignment error can include skew components and higher-order components, consider, for the sake of simplicity, shift components, magnification components, rotation components, and trapezoid components which have larger influences.

Likewise, the following equations (2) are defined with respect to the marks arranged at other positions.

$$\Delta x_2 = Sx + Mx \cdot x_2 + rot\theta x \cdot y_2 + Tx \cdot x_2 \cdot y_2$$

$$\Delta y_2 = Sy + My \cdot y_2 + rot\theta y \cdot x_2 + Ty \cdot x_2 \cdot y_2$$

$$\Delta x_3 = Sx + Mx \cdot x_3 + rot\theta x \cdot y_3 + Tx \cdot x_3 \cdot y_3$$

$$\Delta y_3 = Sy + My \cdot y_3 + rot\theta y \cdot x_3 + Ty \cdot x_3 \cdot y_3$$

$$\Delta x_4 = Sx + Mx \cdot x_4 + rot\theta x \cdot y_4 + Tx \cdot x_4 \cdot y_4$$

$$\Delta y_4 = Sy + My \cdot y_4 + rot\theta y \cdot x_4 + Ty \cdot x_4 \cdot y_4 \quad (2)$$

In order to provide a specific example, the size of a full shot region is defined as 4a×6a. In this case, the positions of the marks MMK on the pattern region are expressed as equations (3) given below:

$$(x_1, y_1) = (2a, 3a)$$

$$(x_2, y_2) = (2a, a)$$

$$(x_3, y_3) = (0, a)$$

$$(x_4, y_4) = (0, 3a) \quad (3)$$

For the sake of simplicity, consider only an alignment error in the X direction, that is, equations (4) given below:

$$\Delta x_1 = Sx + 2a \cdot Mx + 3a \cdot rot\theta x + 6a^2 Tx$$

$$\Delta x_2 = Sx + 2a \cdot Mx + a \cdot rot\theta x + 2a^2 Tx$$

$$\Delta x_3 = Sx + a \cdot rot\theta x$$

$$\Delta x_4 = Sx + 3a \cdot rot\theta x \quad (4)$$

When this alignment error is solved with respect to each component, equations (5) given below are established:

$$Sx = \frac{1}{2} \cdot (3\Delta x_3 - \Delta x_4)$$

$$Mx = \frac{1}{4}a \cdot (-\Delta x_1 + 3\Delta x_2 - 3\Delta x_3 + \Delta x_4)$$

$$Rot\theta x = \frac{1}{2}a \cdot (-\Delta x_3 + \Delta x_4)$$

$$Tx = \frac{1}{4}a^2 \cdot (\Delta x_1 - \Delta x_2 + \Delta x_3 - \Delta x_4) \quad (5)$$

Consider, for example, Sx and Rotθx. In this case, although the relative positions between four mark pairs are detected, only the relative positions between two mark pairs of the four mark pairs are reflected in Sx and Rotθx. In addition, consider Mx. In this case, coefficients are applied to detection results on the relative positions between four mark pairs. It is, therefore, obvious that the detection results on the relative positions between the four mark pairs with respect to Mx differ in influence. Accordingly, when detection results on the relative positions between a plurality of mark pairs include an error, a sufficient averaging effect cannot be obtained in spite of the fact that the relative positions between a plurality of mark pairs are detected. In addition, a computation result will place a disproportionate emphasis on detection results on some mark pairs.

Accordingly, in this embodiment, the controller CNT uses a plurality of marks on the chip region CR-2 of the partial shot region which falls inside the effective region of the substrate S for the detection of an alignment error. The controller CNT determines the origin position of the coordinate system for the computation of an alignment error based on the arrangement of the plurality of marks. On the other hand, with respect to a full shot region, the controller CNT uses the marks on the four corners (that is, the four mark pairs) to detect an alignment error, and determines the origin position of the coordinate system for the computation of an alignment error based on the arrangement of the four mark pairs.

In other words, the controller CNT uses different marks (mark pairs) for the detection of an alignment error between a partial shot region and a full shot region. However, the controller CNT determines the origin position of the coordinate system for the computation of an alignment error in accordance with a plurality of marks (mark pairs) used for the detection of an alignment error with respect to both a partial shot region and a full shot region.

In an example, the controller CNT determines the center of a plurality of marks (mark pairs) used for the detection of an alignment error as the origin position of the coordinate system for the computation of an alignment error in both a partial shot region and a full shot region. The center of a plurality of marks (mark pairs) can be, for example, the center of a figure defined by vertices thereof which are positions of the plurality of marks (mark pairs). In this case, the area of a figure defined by vertices thereof which are positions of a plurality of marks selected for a partial shot region is smaller than the area of a figure defined by vertices thereof which are positions of a plurality of marks selected for a full shot region.

Alternatively, the controller CNT can determine the origin position of the coordinate system for the computation of an alignment error such that the origin position is located inside the above figure with respect to both a partial shot region and a full shot region depending on allowable accuracy for the correction of an alignment error. The number of the plurality of marks (mark pairs) can be at least three.

In another aspect, the controller CNT can determine an origin position such that the distances between the origin position and a plurality of marks (mark pairs) used to detect an alignment error are equal to each other within an allowable accuracy (allowable range) with respect to both a partial shot region and a full shot region. Alternatively, the controller CNT can determine an origin position such that the origin position coincides with the center of gravity of a figure defined by vertices thereof which are positions of a plurality of marks (mark pairs) used for the detection of an alignment error with respect to both a partial shot region and a full shot region.

In still another aspect, the controller CNT may be configured to determine an origin position in accordance with shot regions (a partial shot region and a full shot region). For example, this determination can be performed based on a table including information designating shot regions and corresponding origin positions.

Figure 5B:
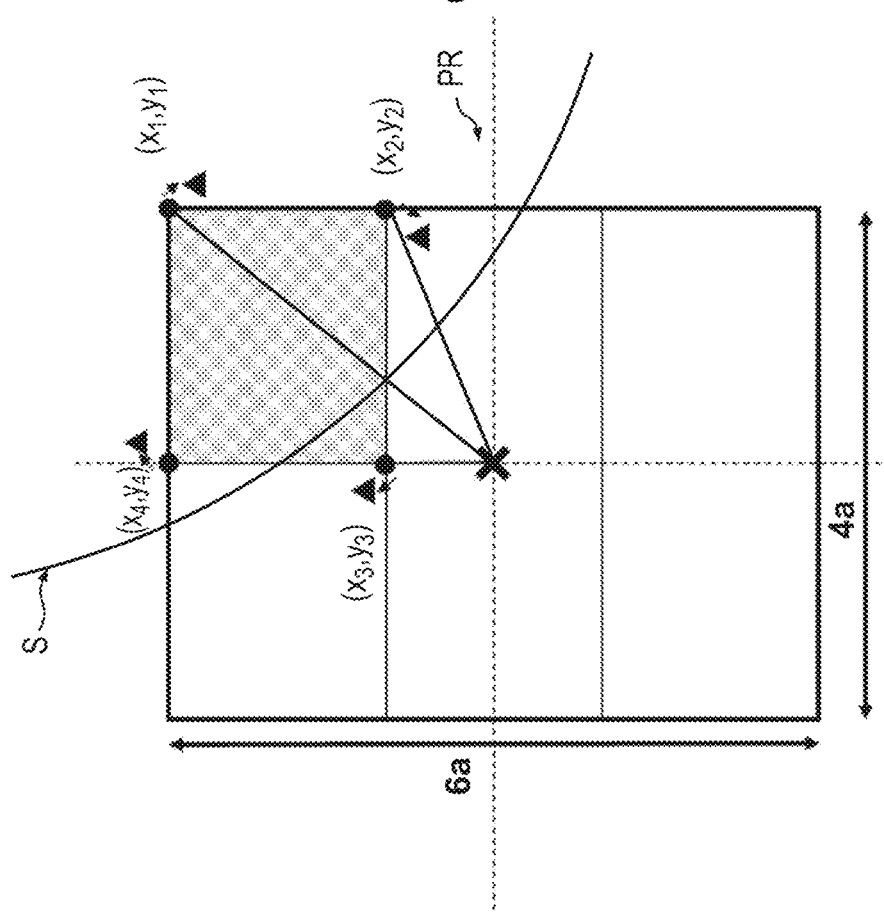

FIG. 5B shows a case in which an origin position is determined such that the distances between the origin position and a plurality of marks (mark pairs) used to detect an alignment error are equal to each other with respect to a partial shot region.

When such an origin position is determined, positions $(x_1, y_1)$, $(x_2, y_2)$, $(x_3, y_3)$, and $(x_4, y_4)$ of the marks MMK on the pattern region PR which correspond to the mark SMK at the upper left of the chip region CR-2 are respectively expressed as equations (6) given below:

$$(x_1, y_1) = (a, a)$$

$$(x_2, y_2) = (a, -a)$$

$$(x_3, y_3) = (-a, -a)$$

$$(x_4, y_4) = (-a, a) \quad (6)$$

Therefore, $\Delta x_1$, $\Delta x_2$, $\Delta x_3$, and $\Delta x_4$ are expressed as equations (7) given below:

$$\Delta x_1 = Sx + a \cdot Mx + a \cdot rot\theta x + a^2 \cdot Tx$$

$$\Delta x_2 = Sx + a \cdot Mx - a \cdot rot\theta x - a^2 \cdot Tx$$

$$\Delta x_3 = Sx - a \cdot Mx - a - rot\theta x + a^2 \cdot Tx$$

$$\Delta x_4 = Sx - a \cdot Mx + a - rot\theta x - a^2 \cdot Tx \quad (7)$$

Solving this alignment error with respect to the respective components will provide equations (8) given below:

$$Sx = \frac{1}{4} \cdot (\Delta x_1 + \Delta x_2 + \Delta x_3 + \Delta x_4)$$

$$Mx = \frac{1}{4}a \cdot (\Delta x_1 + \Delta x_2 - \Delta x_3 - \Delta x_4)$$

$$Rot\theta x = \frac{1}{4}a \cdot (\Delta x_1 - \Delta x_2 - \Delta x_3 + \Delta x_4)$$

$$Tx = \frac{1}{4}a^2 \cdot (\Delta x_1 - \Delta x_2 + \Delta x_3 - \Delta x_4) \quad (8)$$

The components Sx, Mx, Rotθx, and Tx each are included in the alignment error with similar degrees of sensitivity at the relative positions between the four mark pairs. Accordingly, averaging detection results on the relative positions between a plurality of mark pairs will provide an effect of reducing an error included in a computation result on an alignment error.

This embodiment is useful when the area (size) of a region on which a pattern is formed by one imprint process differs among a plurality of shot regions. However, the embodiment can also be applied to a case in which the area (size) of a region on which a pattern is formed by one imprint process remains the same among a plurality of shot regions. For example, when the arrangement (the positions and/or the number) of a plurality of marks used for the detection of an alignment error differs in accordance with shot regions, the origin position of the coordinate system can be changed in accordance with the arrangement of the plurality of marks. When, for example, an abnormal mark is formed on a substrate in a previous step, the mark can sometimes be excluded from marks as detection targets. In such a case, the origin position of the coordinate system can be changed in accordance with the arrangement of a plurality of marks as final detection targets.

When the controller CNT determines an origin position regardless of user's intention, the controller CNT can arrange the origin position at an unintended position. Accordingly, this apparatus may be provided with a setting function of validating or invalidating a function of causing the controller CNT to determine an origin position. In addition, when the controller CNT determines an origin position, the apparatus may be provided with a limiting function of limiting a region in which an origin position can be arranged. Such setting function and limiting function can be provided by a user interface UI that communicates with the controller CNT, as exemplarily shown in FIG. 1.

Figure 6:
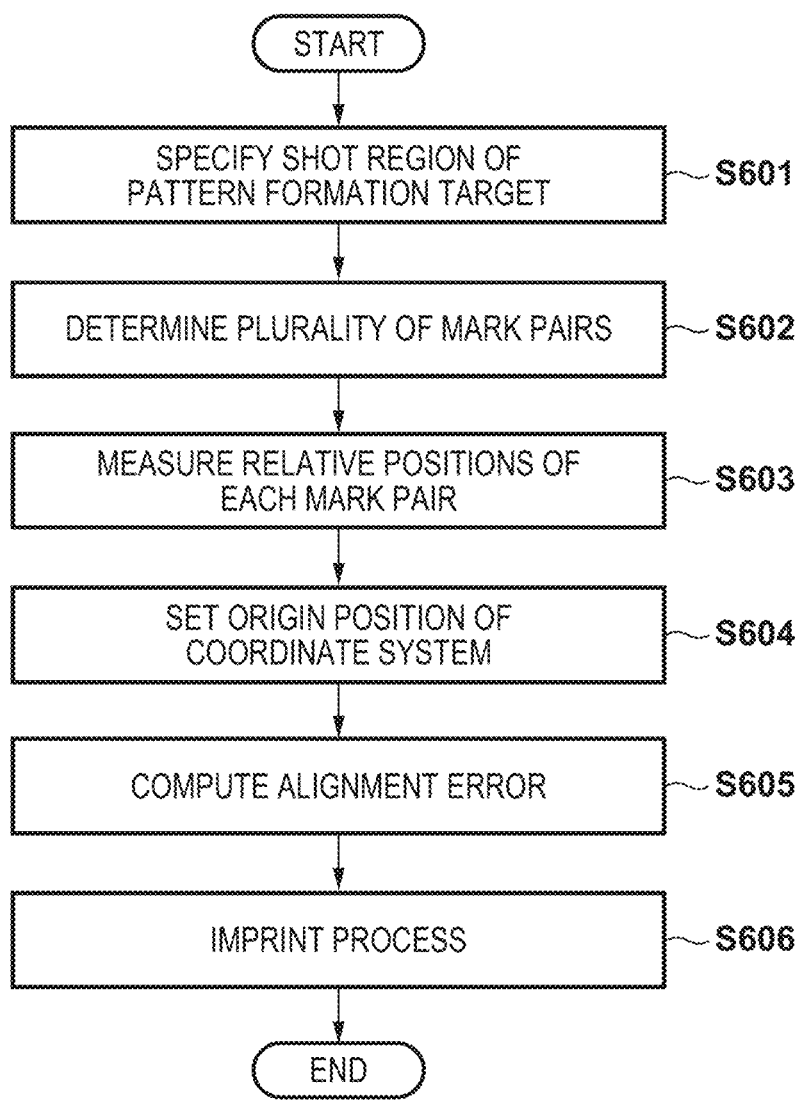
FIG. 6 is a flowchart showing an operation for pattern formation for one shot region.

FIG. 6 exemplarily shows an operation for forming a pattern on one shot region SR of the substrate S in the imprint apparatus 100 according to the first embodiment of the present invention. The controller CNT controls this operation. Assume that before this operation, the imprint material IM is arranged with respect to the shot region SR as a pattern formation target by the dispenser DSP or an apparatus outside the imprint apparatus 100. The imprint material IM can be arranged with respect to one shot region SR or can be continuously arranged with respect to a plurality of shot regions SR.

In step S601, the controller CNT specifies the shot region SR as a pattern formation target. In step S602 (determination step), the controller CNT determines a plurality of marks SMK for the alignment of the shot region SR determined in step S601 with the mold M (its pattern region PR). In this case, determining a plurality of marks SMK on the shot region SR will determine a plurality of corresponding marks MMK on the mold M which respectively correspond to the plurality of the marks SMK on the shot region SR. That is, in step S602, the controller CNT determines a plurality of mark pairs (each mark pair is constituted by the mark SMK and the mark MMK) for the alignment of the shot region SR specified in step S601 with the mold M (its pattern region PR). In this case, the relative positions between the plurality of marks (mark pairs) determined for a full shot region can typically differ from the relative positions between the plurality of marks (mark pairs) determined for a partial shot region.

In step S603 (measurement step), the controller CNT controls the alignment detection system AS to detect the relative positions (the relative positions between the marks SMK and the marks MMK) between the plurality of mark pairs determined in step S602. This causes the controller CNT to measure the relative positions between the plurality of mark pairs selected in step S602. In step S604 (setting step), the controller CNT sets the origin position of the coordinate system for the computation of the alignment error between the shot region SR specified in step S601 and the mold M (its pattern region PR) based on the arrangement of the plurality of mark pairs selected in step S602. Step S604 includes a step of determining an origin position. A method of determining an origin position can comply with the above description. Step S604 can be executed before step S603 as long as executed after step S602. In step S604, the controller CNT may set the origin position of the coordinate system for the computation of the alignment error between the shot region SR and the mold M (its pattern region PR) based on the shot region SR specified in step S601. A method of determining an origin position can comply with the above description. In this case, step S604 can be executed before step S603 or step S602 as long as it is executed after step S601.

In step S605, the controller CNT computes an alignment error based on the measurement result obtained in step S603 (measurement step) and the origin position set in step S604 (setting step). A method of computing an alignment error can comply with the above description. In step S606, the controller CNT controls the driving mechanism DM, the deformation mechanism MAG, the shot region deformation unit SRD, and the curing unit CU to execute an imprint process.

The second embodiment of the present invention will be described below. Note that matters that are not mentioned in the second embodiment can comply with the first embodiment. FIGS. 7A to 7D each exemplarily show a rule for specifying a component of an alignment error. In the following description, each mark pair is constituted by one mark MMK (black circle) and one mark SMK (black triangle). Note that because either mark can be used as a reference concerning deformation, the relationship between MMK and SMK of each mark pair may be reversed.

Figure 7A:
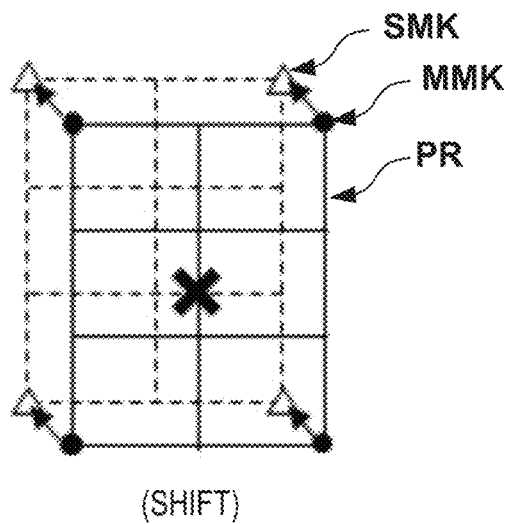
FIGS. 7A to 7D are views for exemplarily explaining rules for specifying alignment error components.
Figure 7B:
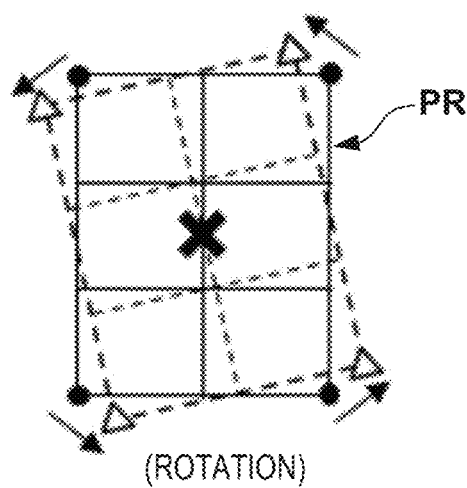

As shown in FIG. 7A, when the relative position between the mark MMK (black circle) on a pattern region PR and the mark SMK (black triangle) on a shot region SR remains the same between each of the four mark pairs within an allowable error, a controller CNT determines that the alignment error is a shift component. In this case, each relative position is specified by the direction of the mark SMK relative to the mark MMK and the distance between the mark MMK and the mark SMK. As shown in FIG. 7B, when the four marks MMK overlay on the four marks SMK within an allowable error upon rotating the figure defined by vertices thereof which are positions of the four marks MMK about the center of the pattern region PR, the controller CNT determines that the alignment error is a rotation component.

Figure 7C:
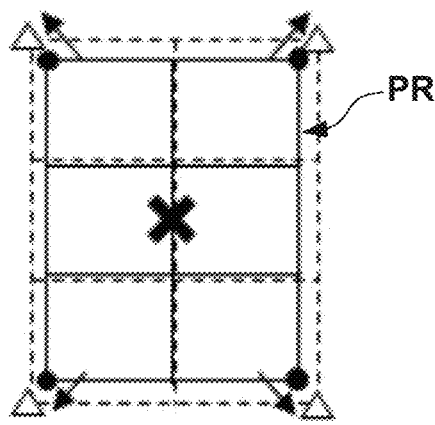
Figure 7D:
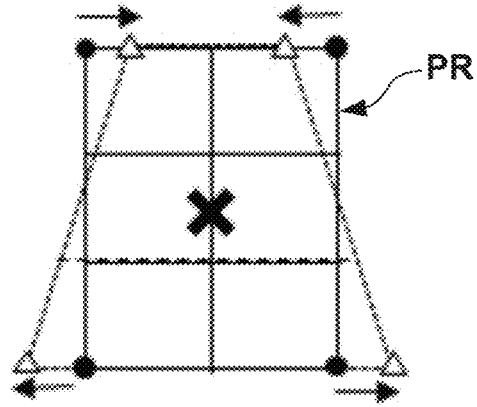

As shown in FIG. 7C, when the four marks MMK overlay on the four marks SMK within an allowable error upon performing enlargement/reduction of the figure defined by vertices thereof which are positions of the four marks MMK at the center of the pattern region PR as the center of enlargement/reduction, the controller CNT determines that the alignment error is a magnification component. As shown in FIG. 7D, when the four marks MMK overlay on the four marks SMK upon bringing the two ends of the first side of the rectangle defined by vertices thereof which are positons of the four marks MMK close to each other and separating the two ends of the second side of the rectangle from each other, the controller CNT determines that the alignment error is a trapezoid component. In this case, the first and second sides are two sides as opposite sides.

An example of determining a component of an alignment error of a partial shot region according to the rules shown in FIGS. 7A to 7D will be described as a comparative example with reference to FIG. 8. Referring to FIG. 8, a partial shot region has only one chip region CR in the effective region of a substrate S. Referring to FIG. 8, the black circles indicate the four marks MMK corresponding to the four marks SMK respectively arranged at the four corners of the chip region CR of the partial shot region. Referring to FIG. 8, when the figure defined by vertices thereof which are positions of the four marks MMK is enlarged/reduced at the center of the pattern region PR as the center of enlargement/reduction, the four marks MMK overlay on the four marks SMK within an allowable error. Therefore, the alignment error is determined to be a magnification component according to the rules shown in FIGS. 7A to 7D.

Distortion is likely to occur in a peripheral portion (a portion near an edge) of the substrate S during a manufacturing process. The chip region CR of a partial shot region can have larger distortion than the chip region CR of a central portion of the substrate S or a full shot region. When the alignment error measured by using the marks on the chip region CR of the partial shot region is converted into a correction value for the entire pattern region PR, the correctable ranges of a deformation mechanism MAG and a shot region deformation unit SRD may be exceeded.

In the example shown in FIG. 8, the marks MMK arranged at the four corners of the chip region CR of the partial shot region can be overlaid on the corresponding marks SMK by shifting the marks MMK. That is, in the example shown in FIG. 8, the alignment error can be determined to be a shift error. If it be so, the alignment error can be reduced by shift component correction using a driving mechanism DM instead of magnification component correction using the deformation mechanism MAG.

Accordingly, in the second embodiment, the controller CNT sets the origin position of a coordinate system for the computation of an alignment error of a partial shot region according to the first embodiment, and computes each component of the alignment error. In this case, as exemplarily shown in FIG. 9, the alignment error in FIG. 8 is decomposed into a shift component, magnification component, rotation component, and trapezoid component, and the main component is the shift component. In this case, when the alignment error is decomposed into a plurality of components, an order of priority may be provided. For example, a higher priority is preferably given to shift components and rotation components that can be corrected by the driving mechanism DM than to magnification components and trapezoid components that should be corrected by the deformation mechanism MAG and the shot region deformation unit SRD. In this case, components with higher priorities are determined first, and the remaining alignment error is decomposed into components with lower priorities.

The user may set an order of priority via a user interface UI. The user may also set a rule for decomposing an alignment error into a plurality of components via the user interface UI.

Figure 10A:
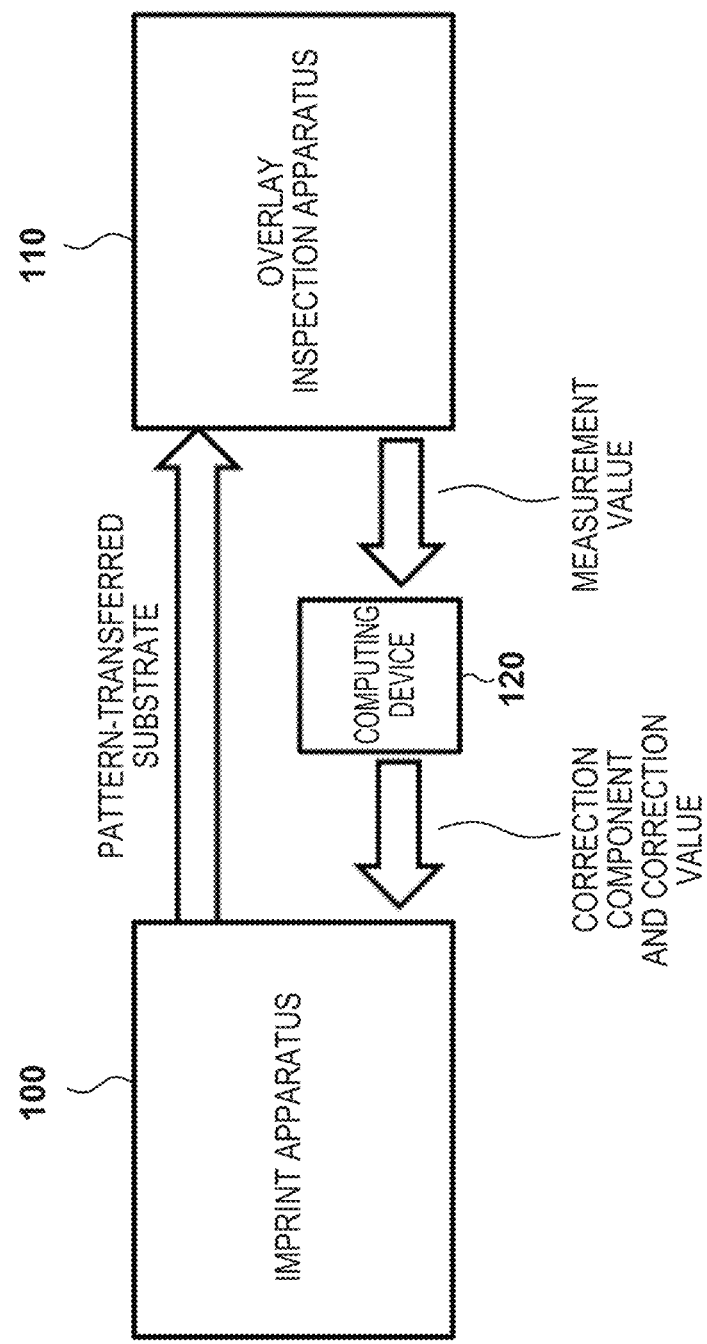
FIGS. 10A and 10B are block diagrams for explaining the third embodiment of the present invention.

A case in which a correction value is determined by an overlay inspection apparatus 110 and applied to an imprint apparatus 100 will be described as the third embodiment of the present invention with reference to FIGS. 10A and 10B.

A comparative example will be described first with reference to FIG. 10A. A substrate on which a pattern formed from a cured product of an imprint material IM is formed by the imprint apparatus 100, that is, a substrate onto which a pattern on a mold M is transferred, can be evaluated by using the overlay inspection apparatus 110. First of all, a second pattern is formed on a substrate (to be referred to as the first substrate) having a first pattern by an imprint process using the imprint apparatus 100 and the mold M. The first substrate is then sent to an overlay inspection apparatus 110. The overlay inspection apparatus 110 measures the overlay error between the first pattern on the first substrate and the second pattern formed on the first pattern. A computing device 120 computes a correction value (offset value) based on the overlay error measured by the overlay inspection apparatus 110. This value is set in the imprint apparatus 100.

In general, the overlay inspection apparatus 110 as an external apparatus of the imprint apparatus 100 is specifically designed for measurement, and hence can measure many measurement points (evaluation portions) without decreasing productivity. Accordingly, using the overlay inspection apparatus 110 makes it possible to accurately determine a correction value (offset value). The imprint apparatus 100 can perform alignment based on the alignment error component determined based on the measurement result obtained by using the alignment detection system AS and a preset offset value.

However, in using the scheme of determining the origin position of a coordinate system for the computation of an alignment error by using the imprint apparatus 100 as in the first and second embodiments, the computation result obtained by the computing device 120 configured to perform computation as in the above comparative example does not match the imprint apparatus 100. In this case, although the computing device 120 preferably incorporates a computation algorithm complying with the first and second embodiments, it may be difficult for the computing device 120 as a general-purpose device for a manufacturing process to incorporate such an algorithm.

Figure 10B:
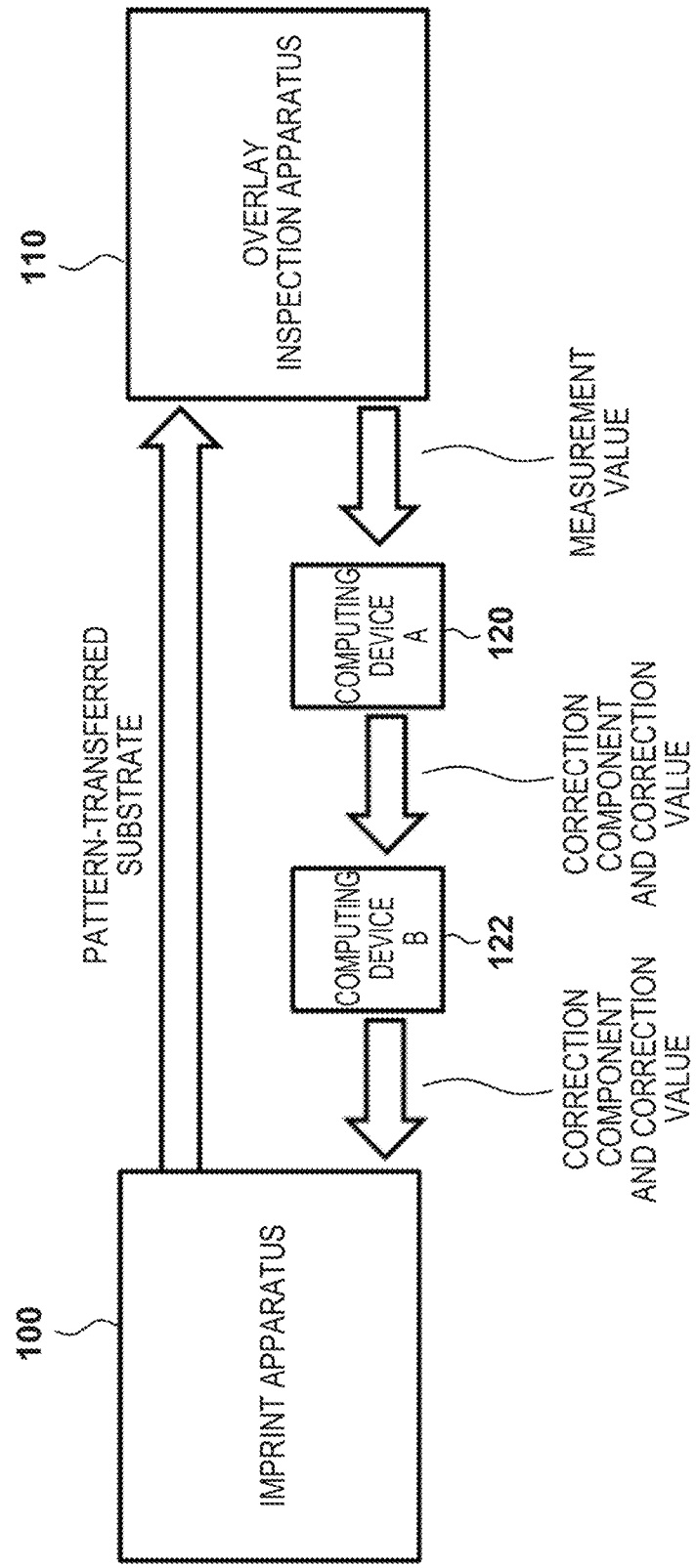

The system shown in FIG. 10B is configured to solve the above problem. In the third embodiment, a computing device 122 re-computes a correction value matching the imprint apparatus 100 according to the first or second embodiment based on the correction value output from the computing device 120.

First of all, based on the position of a measurement point in the measurement performed by the overlay inspection apparatus 110 and the correction value computed by the computing device 120, the computing device 122 inversely computes a measurement value at the measurement point. Subsequently, the computing device 122 computes a correction value for each correction component (alignment error component) upon setting the origin position determined for each shot region in the imprint apparatus 100, and sets an offset value corresponding to the correction value in the imprint apparatus 100. An alignment error can include, as its component, at least one of a shift component, magnification component, rotation component, trapezoid component, and skew component. An offset value may be applied in the form of correcting the relative position detected by each alignment scope.

Figure 11:
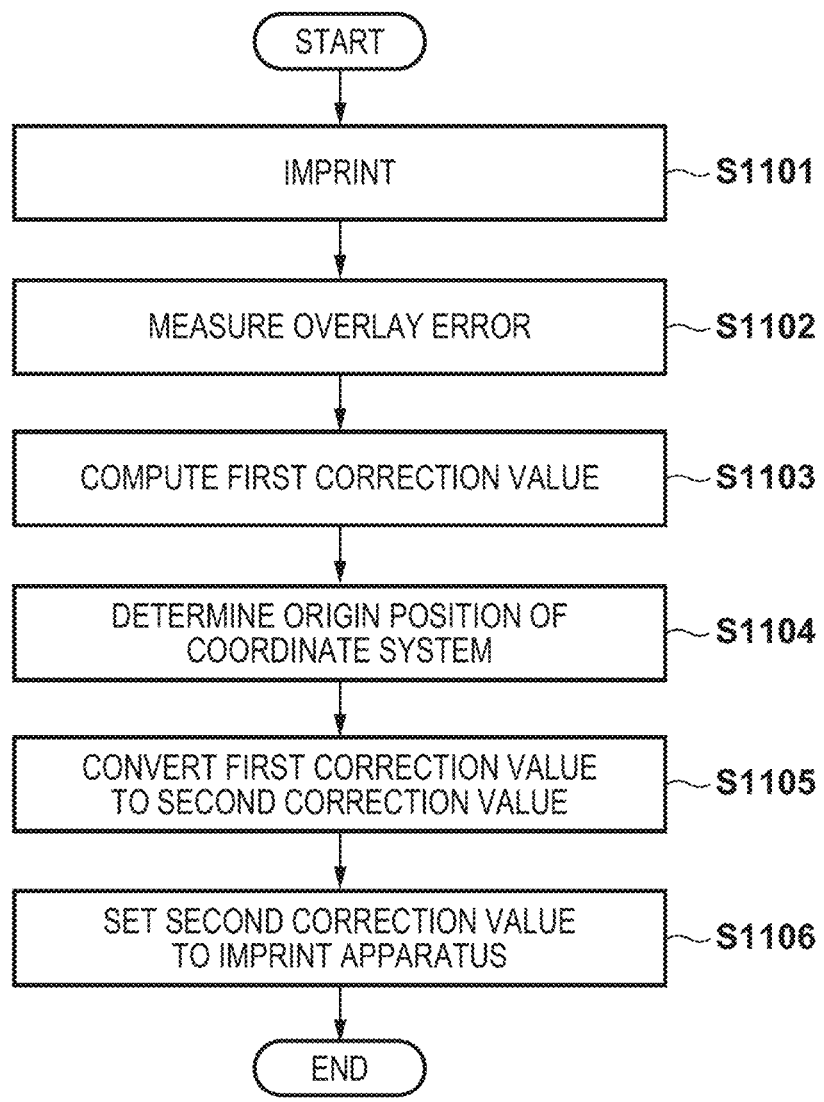
FIG. 11 is a flowchart showing procedures in an adjustment method according to the third embodiment of the present invention.

FIG. 11 shows a procedure in an adjustment method according to the third embodiment of the present invention. This adjustment method is an adjustment method of adjusting the imprint apparatus 100 in the system shown in FIG. 10B. In step S1101 (imprint step), an imprint process is formed to form a second pattern on a first pattern on a first substrate by using the imprint apparatus 100 and the mold M. The first substrate may be a substrate for a test or a substrate for the manufacture of a device. Alignment in an imprint process is performed in accordance with the first or second embodiment.

In step S1102 (measurement step), the first substrate on which the first pattern is formed in step S1101 is sent to the overlay inspection apparatus 110, and the overlay inspection apparatus 110 measures the overlay error between the first pattern and the second pattern. In step S1103 (first computation step), the computing device 120 computes a first correction value based on the overlay error obtained in step S1102 by using a first origin position as the origin position of the coordinate system set in advance in the computing device 120 to calculate an alignment error.

In step S1104 (determination step), the computing device 122 determines a second origin position as the origin position of the coordinate system based on the arrangement of a plurality of marks for alignment between the mold M and a shot region of a second substrate processed by the imprint apparatus 100. The second origin position is the origin position of a coordinate system for causing the imprint apparatus 100 to compute the alignment error between a shot region of the second substrate and the mold M. The computing device 122 acquires, from the imprint apparatus 100, information concerning the layout of shot regions in an imprint process executed by using the mold M, and can determine a second origin position based on the acquired information. In step S1104, the second origin position may be determined based on the arrangement of a plurality of marks for alignment between the mold M and a shot region of the second substrate processed by the imprint apparatus 100.

In step S1105 (second computation step), the computing device 122 converts the first correction value into a second correction value based on the second origin position. In step S1106 (setting step), the computing device 122 sets an offset value corresponding to the second correction value in the imprint apparatus 100.

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. The optical element includes a microlens, a light-guiding member, a waveguide, an antireflection film, diffraction grating, a light polarization element, a color filter, a light emitting element, a display, a solar battery, or the like. The MEMS includes a DMD, a microchannel, an electromechanical transducer, or the like. The recording element includes an optical disk such as a CD or DVD, a magnetic disk, a magnetooptical disk, a magnetic head, or the like. The sensor includes a magnetic sensor, an optical sensor, a gyro sensor, or the like. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

Figure 12A:
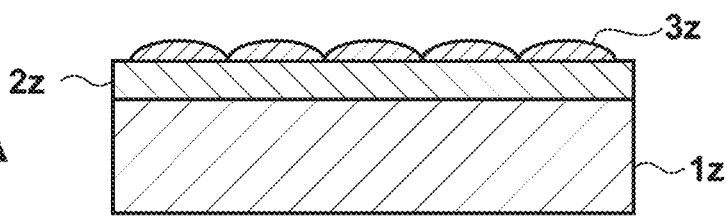
FIGS. 12A to 12F are sectional views exemplarily showing a method of manufacturing an article.

A method of manufacturing an article in which an imprint apparatus forms a pattern on a substrate, processes the substrate on which the pattern is formed, and manufactures an article from the processed substrate will be described next. As shown FIG. 12A, a substrate $1z$ such as a silicon wafer with a processed material $2z$ such as an insulator formed on the surface is prepared. Next, an imprint material $3z$ is applied to the surface of the processed material $2z$ by an inkjet method or the like. A state in which the imprint material $3z$ is applied as a plurality of droplets onto the substrate is shown here.

Figure 12B:
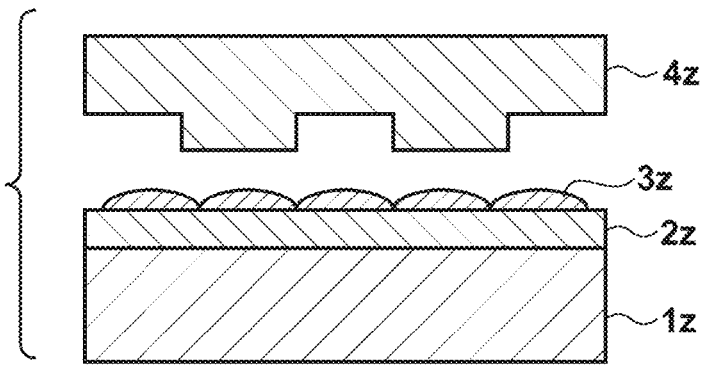
Figure 12C:
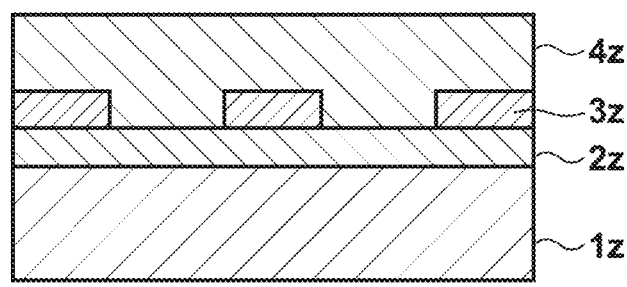

As shown in FIG. 12B, a side of a mold $4z$ for imprint with a concave-convex pattern is directed toward and made to face the imprint material $3z$ on the substrate. As shown FIG. 12C, the substrate $1z$ to which the imprint material $3z$ is applied is brought into contact with the mold $4z$, and a pressure is applied. The gap between the mold $4z$ and the processed material $2z$ is filled with the imprint material $3z$. In this state, when the imprint material $3z$ is irradiated with energy for curing via the mold $4z$, the imprint material $3z$ is cured.

Figure 12D:
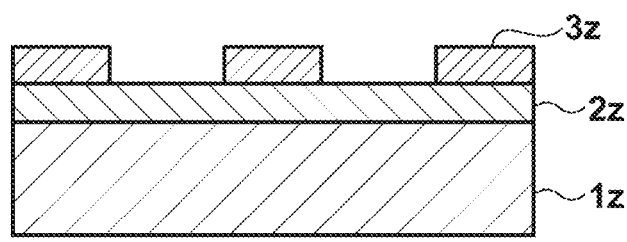

As shown in FIG. 12D, after the imprint material $3z$ is cured, the mold $4z$ is separated from the substrate $1z$, and the pattern of the cured product of the imprint material $3z$ is formed on the substrate $1z$. In the pattern of the cured product, the concave portion of the mold corresponds to the convex portion of the cured product, and the convex portion of the mold corresponds to the concave portion of the cured product. That is, the concave-convex pattern of the mold $4z$ is transferred to the imprint material $3z$.

Figure 12E:
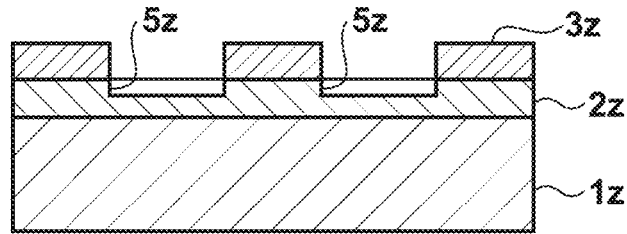
Figure 12F:
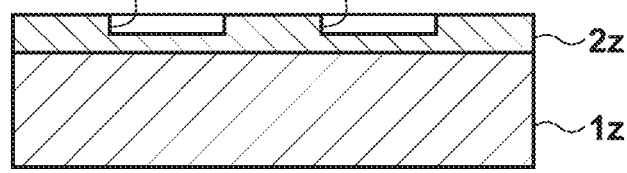

As shown in FIG. 12E, when etching is performed using the pattern of the cured product as an etching resistant mold, a portion of the surface of the processed material $2z$ where the cured product does not exist or remains thin is removed to form a groove $5z$. As shown in FIG. 12F, when the pattern of the cured product is removed, an article with the grooves $5z$ formed in the surface of the processed material $2z$ can be obtained. Here, the pattern of the cured product is removed. However, instead of removing the pattern of the cured product after the process, it may be used as, for example, an interlayer dielectric film included in a semiconductor element or the like, that is, a constituent member of an article.

Figure 13A:
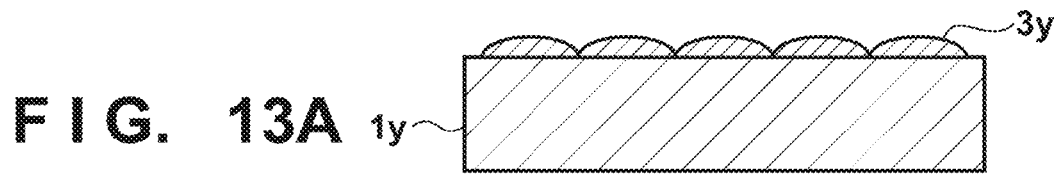
FIGS. 13A to 13D are sectional views exemplarily showing a method of manufacturing an article.

Another article manufacturing method will be described next. As shown in FIG. 13A, a substrate $1y$ such as silica glass is prepared, and then an imprint material $3y$ is applied on the surface of the substrate $1y$ by the inkjet method or the like. A layer of another material such as a metal or a metallic compound may be provided on the surface of the substrate $1y$, as needed.

Figure 13B:
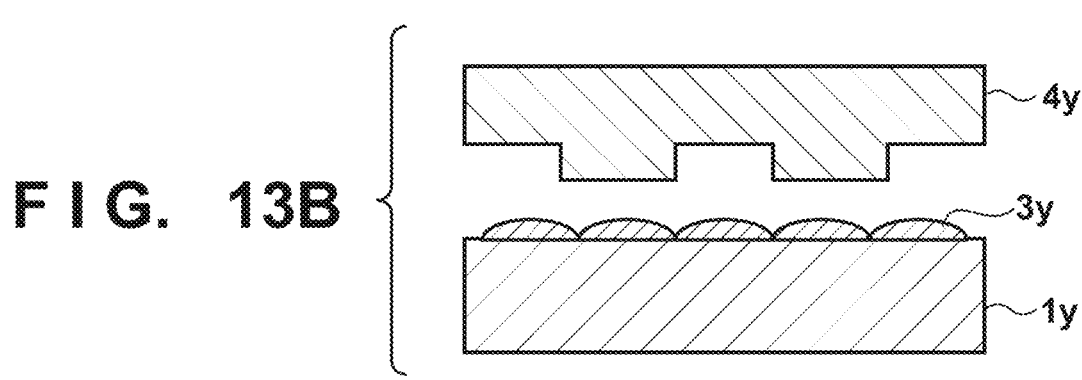
Figure 13C:
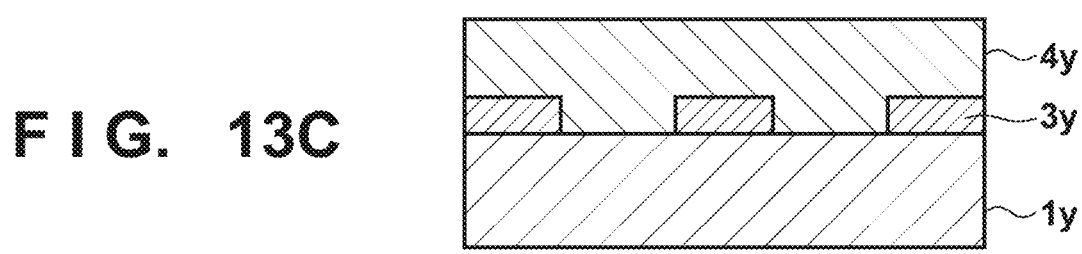

As shown in FIG. 13B, a side of an imprint mold $4y$ on which its three-dimensional pattern is formed faces the imprint material $3y$ on the substrate. As shown in FIG. 13C, a mold $4y$ and the substrate $1y$ to which the imprint material $3y$ is applied are brought into contact with each other, and a pressure is applied. The imprint material $3y$ fills the gap between the mold $4y$ and the substrate $1y$. The imprint material $3y$ is cured by irradiating it with light through the mold $4y$ in this state.

Figure 13D:
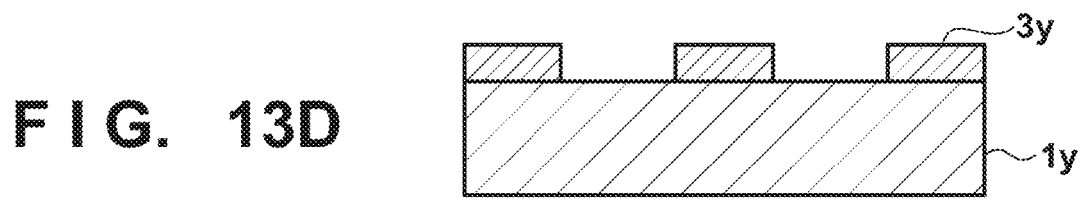

As shown in of FIG. 13D, the pattern of the cured product of the imprint material 3y is formed on the substrate 1y by releasing the mold 4y and the substrate 1y from each other after curing the imprint material 3y. An article including the pattern of the cured product as a constituent member is thus obtained. Note that if the substrate 1y is etched by using the pattern of the cured product as a mask in the state of FIG. 13D, it is also possible to obtain an article with a concave portion and a convex portion being inverted with respect to the mold 4y, for example, an imprint mold.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-123520, filed Jun. 28, 2018, which is hereby incorporated by reference herein in its entirety.

What is claimed is:

1. A method for forming a pattern of an imprint material on a shot region of a substrate by using a mold, the method comprising:
    determining a plurality of marks for alignment of the shot region and the mold;
    performing measurement for the alignment using the plurality of marks determined in the determining;
    setting an origin position of a coordinate system for acquisition of an alignment error between the shot region and the mold based on an arrangement of the plurality of marks determined in the determining, wherein the origin position to be set in the setting is changed in accordance with a change in the arrangement of the plurality of marks determined in the determining; and
    acquiring the alignment error based on a measurement result in the measurement and the origin position determined in the setting.

2. The method according to claim 1, further comprising transferring a pattern of the mold onto an imprint material on the shot region upon performing alignment of the shot region and the mold based on the alignment error acquired in the acquiring.

3. The method according to claim 1, wherein in the setting, the origin position is set such that the origin position is arranged inside a figure defined by vertices thereof which are positions of the plurality of marks.

4. The method according to claim 1, wherein the number of the plurality of marks is at least three.

5. The method according to claim 1, wherein in the setting, the origin position is determined such that distances between the plurality of marks and the origin position are equalized within an allowable range.

6. The method according to claim 1, wherein in the setting, the origin position is determined such that the origin position coincides with, within an allowable range, a center of gravity of a figure defined by vertices thereof which are the positions of the plurality of marks.

7. The method according to claim 1, wherein the alignment error acquired in the acquiring includes at least one of a shift component, a magnification component, a rotation component, a trapezoid component, and a skew component.

8. The method according to claim 1, further comprising determining at least one component to be acquired as the alignment error among a plurality of components.

9. A method for forming a pattern of an imprint material on a shot region of a substrate by using a mold, the method comprising:
    determining a plurality of marks for alignment of the shot region and the mold;
    performing measurement for the alignment using the plurality of marks determined in the determining;
    setting an origin position of a coordinate system for acquisition of an alignment error between the shot region and the mold based on an arrangement of the plurality of marks determined in the determining; and
    acquiring the alignment error based on a measurement result in the measurement and the origin position determined in the setting,
    wherein the substrate includes a first shot region having a rectangular shape and a second shot region smaller than the first shot region and having a shape defined by edges of the substrate, and
    in the determining, the plurality of marks for the first shot region and the plurality of marks for the second shot region are selected such that a relative position between the plurality of marks selected for the first shot region differs from a relative position between the plurality of marks selected for the second shot region.

10. The method according to claim 9, wherein an area of a figure defined by vertices thereof which are positions of the plurality of marks selected for the second shot region is smaller than an area of a figure defined by vertices thereof which are positions of the plurality of marks selected as vertices for the first shot region in the determining.

11. A method for forming a pattern of an imprint material on a plurality of shot regions of a substrate by using a mold, the method comprising:
    performing measurement for alignment of the mold and a shot region selected from the plurality of shot regions;
    setting an origin position of a coordinate system for acquisition of an alignment error between the selected shot region and the mold based on the selected shot region, wherein the origin position to be set in the setting is changed in accordance with a change in selected shot region; and acquiring the alignment error based on a measurement result obtained in the measurement and the origin position determined in the setting.

12. An imprint apparatus for forming a pattern of an imprint material on a shot region of a substrate by using a mold, the apparatus comprising:
   a measurement device configured to perform measurement for alignment of the shot region and the mold; and
   a controller configured to cause the measurement device to perform the measurement with respect to a plurality of marks selected for alignment of the shot region and the mold, acquire an alignment error between the shot region and the mold based on the measurement result, and control the alignment based on the alignment error,
   wherein the controller determines an origin position of a coordinate system for acquisition of an alignment error between the shot region and the mold based on an arrangement of the plurality of marks selected for alignment of the shot region and the mold, and wherein the origin position to be determined by the controller is changed in accordance with a change in the arrangement of the plurality of marks selected for the alignment of the shot region and the mold.

13. A method of adjusting an imprint apparatus for forming a pattern of an imprint material on a shot region of a substrate by using a mold, the imprint apparatus including (i) a measurement device configured to perform measurement for alignment of the shot region and the mold; and (ii) a controller configured to cause the measurement device to perform the measurement with respect to a plurality of marks for alignment of the shot region and the mold, acquire an alignment error between the shot region and the mold based on the measurement result, and control the alignment based on the alignment error, wherein the controller determines an origin position of a coordinate system for acquisition of an alignment error between the shot region and the mold based on an arrangement of the plurality of marks for alignment of the shot region and the mold,
   the method comprising:
   performing imprinting to form a second pattern on a first pattern on a first substrate by using the imprint apparatus and the mold;
   measuring an overlay error between the first pattern and the second pattern by using an overlay inspection apparatus;
   acquiring a first correction value based on an overlay error obtained in the measuring by using a first origin position as an origin position of a coordinate system for acquisition of an alignment error;
   determining, based on an arrangement of a plurality of marks for alignment of a shot region of a second substrate and the mold which are processed in the imprint apparatus, a second origin position as an origin position of a coordinate system for acquisition of an alignment error between the shot region of the second substrate and the mold;
   converting the first correction value into a second correction value based on the second origin position; and
   setting an offset value corresponding to the second correction value in the imprint apparatus.

14. An imprint apparatus for forming a pattern of an imprint material on a plurality of shot regions of a substrate by using a mold, the apparatus comprising:
   a measurement device configured to perform measurement for alignment of a shot region selected from the plurality of shot regions and the mold; and
   a controller configured to cause the measurement device to perform the measurement with respect to a plurality of marks for alignment of the selected shot region and the mold, acquire an alignment error between the selected shot region and the mold based on the measurement result, and control the alignment based on the alignment error,
   wherein the controller determines an origin position of a coordinate system for acquisition of an alignment error between the selected shot region and the mold based on the selected shot region, and wherein the origin position to be determined by the controller is changed in accordance with a change in selected shot region.

15. A method of adjusting an imprint apparatus for forming a pattern of an imprint material on a plurality of shot regions of a substrate by using a mold, the imprint apparatus including (i) a measurement device configured to perform measurement for alignment of a shot region selected from the plurality of shot regions and the mold; and (ii) a controller configured to cause the measurement device to perform the measurement with respect to a plurality of marks for alignment of the selected shot region and the mold, acquire an alignment error between the selected shot region and the mold based on the measurement result, and control the alignment based on the alignment error, wherein the controller determines an origin position of a coordinate system for acquisition of an alignment error between the selected shot region and the mold based on the selected shot region,
   the method comprising:
   performing imprinting to form a second pattern on a first pattern on a first substrate by using the imprint apparatus and the mold;
   measuring an overlay error between the first pattern and the second pattern by using an overlay inspection apparatus;
   acquiring a first correction value based on an overlay error obtained in the measuring by using a first origin position as an origin position of a coordinate system for acquisition of an alignment error;
   determining, based on a shot region selected from a plurality of shot regions of a second substrate which is processed in the imprint apparatus, a second origin position as an origin position of a coordinate system for acquisition of an alignment error between the mold and the selected shot region of the second substrate;
   converting the first correction value into a second correction value based on the second origin position; and
   setting an offset value corresponding to the second correction value in the imprint apparatus.

16. A method for manufacturing an article from a processed substrate, the method comprising:
   forming a pattern on the substrate by using an imprint apparatus defined in claim 12; and
   processing the substrate on which the pattern is formed in the forming.

17. A method for manufacturing an article from a processed substrate, the method comprising:
   forming a pattern on the substrate by using an imprint apparatus defined in claim 14; and
   processing the substrate on which the pattern is formed in the forming.

* * * * *